(12) United States Patent
Cox

(10) Patent No.: US 9,784,802 B1
(45) Date of Patent: *Oct. 10, 2017

(54) GMR NANOWIRE SENSORS

(71) Applicant: Louisiana Tech Research Corporation, Ruston, LA (US)

(72) Inventor: Bryan Cox, Marion, AR (US)

(73) Assignee: Louisiana Tech Research Corporation, Ruston, LA (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/746,352

(22) Filed: Jun. 22, 2015

Related U.S. Application Data

(63) Continuation-in-part of application No. 13/801,100, filed on Mar. 13, 2013, now Pat. No. 9,103,654.

(60) Provisional application No. 61/622,605, filed on Apr. 11, 2012.

(51) Int. Cl.

| | |
|---|---|
| *G01B 7/14* | (2006.01) |
| *G01R 33/09* | (2006.01) |
| *H01L 43/08* | (2006.01) |
| *H01L 43/12* | (2006.01) |
| *G01D 5/16* | (2006.01) |
| *G01R 33/00* | (2006.01) |
| *B82Y 25/00* | (2011.01) |
| *H01F 1/44* | (2006.01) |

(52) U.S. Cl.
CPC ............ *G01R 33/093* (2013.01); *B82Y 25/00* (2013.01); *G01D 5/16* (2013.01); *G01R 33/0052* (2013.01); *G01R 33/096* (2013.01); *G01R 33/098* (2013.01); *H01F 1/442* (2013.01); *H01L 43/08* (2013.01); *H01L 43/12* (2013.01)

(58) Field of Classification Search
CPC ........ G01D 5/145; G01D 5/147; G01D 5/247; G01D 5/00; G01R 33/09; G01R 33/093; G01B 7/003; G01P 3/487; G01P 3/443; B60L 13/06; B60L 2200/26; H04L 12/2697; H04L 43/50
USPC ......... 324/207.21, 207.22, 207.11, 219, 220; 977/742, 953
See application file for complete search history.

(56) References Cited

U.S. PATENT DOCUMENTS

| | | | |
|---|---|---|---|
| 4,097,802 A * | 6/1978 | Mazzeo ................ | B82Y 25/00 324/252 |
| 6,187,165 B1 * | 2/2001 | Chien ................... | B82Y 25/00 205/118 |
| 6,501,271 B1 | 12/2002 | Lenssen et al. | |
| 6,927,948 B2 | 8/2005 | Gill | |

(Continued)

OTHER PUBLICATIONS

U.S. Appl. No. 84/174,667, filed May 8, 2012, Allemand.

(Continued)

*Primary Examiner* — Thang Le
(74) *Attorney, Agent, or Firm* — Jones Walker LLP

(57) ABSTRACT

A magnetic position sensor having at least one magnetic field sensor including a solidified layer of GMR nanowire carrier fluid formed on a substrate material. The solidified layer of carrier fluid has (i) discrete GMR nanowires each having a diameter of less than about 0.5 um and a length less than about 250 um; and (ii) a concentration of GMR nanowires in the dried layer between about 0.001 and about 10 percent by weight of the solution. The position sensor further includes a detection circuit capable of detecting a change in resistance of the magnetic field sensor.

17 Claims, 10 Drawing Sheets

(56) References Cited

U.S. PATENT DOCUMENTS

| | | | |
|---|---|---|---|
| 7,016,168 B2 | 3/2006 | Li et al. | |
| 7,130,166 B2 | 10/2006 | Gill | |
| 7,926,193 B2 | 4/2011 | Peczalski | |
| 8,031,441 B2 | 10/2011 | Zhang et al. | |
| 8,070,930 B2* | 12/2011 | Penner | B82Y 30/00 205/118 |
| 8,877,345 B2* | 11/2014 | Cornelius | B01J 19/0093 428/573 |
| 8,927,464 B2* | 1/2015 | Aizenberg | B81C 1/00206 422/211 |
| 2002/0054461 A1* | 5/2002 | Fujiwara | B82Y 10/00 360/324.1 |
| 2002/0175408 A1* | 11/2002 | Majumdar | B82Y 10/00 257/734 |
| 2006/0007605 A1 | 1/2006 | Li et al. | |
| 2007/0111503 A1* | 5/2007 | Jeon | B82Y 10/00 438/618 |
| 2007/0200477 A1* | 8/2007 | Tuominen | B82Y 10/00 313/309 |
| 2007/0221917 A1* | 9/2007 | Chin | B82Y 10/00 257/40 |
| 2009/0155617 A1* | 6/2009 | Kim | B82Y 5/00 428/611 |
| 2009/0283304 A1 | 11/2009 | Winoto | |
| 2010/0024231 A1 | 2/2010 | Peczalski | |
| 2010/0223797 A1* | 9/2010 | Peczalski | G01B 7/003 33/355 R |
| 2012/0019241 A1 | 1/2012 | Patak | |
| 2012/0097059 A1 | 4/2012 | Allemand et al. | |
| 2012/0126807 A1 | 5/2012 | Beach et al. | |
| 2012/0251926 A1* | 10/2012 | Shirvanian | H01M 4/8642 429/530 |
| 2012/0322164 A1* | 12/2012 | Lal | B82Y 10/00 436/501 |
| 2013/0240348 A1* | 9/2013 | Mi | H01L 31/03044 204/157.5 |
| 2013/0285008 A1* | 10/2013 | Volinsky | B82Y 10/00 257/9 |
| 2014/0285224 A1 | 9/2014 | Albuschies | |

OTHER PUBLICATIONS

Bellamkonda, R., et al.; Microfabrication of Nanowires-Based GMR Biosensor; Proc. of SPIE vol. 7318 73181H-1-H-7; Apr. 13, 2009.

Cox, Bryan; Nanowire Giant Magnetoresistance Thin Films for Magnetic Sensors; A Dissertation Presented in Partial Fulfillments of the Requirements for the Degree Doctor of Philosophy in Engineering; Aug. 2012

Cox, Bryan, et al.; Nanowire GMR Thin Films for Magnetic Sensors; Jun. 2012.

Nishibe, Yuji, et al.; Thin Film Magnetic Field Sensor Utilizing Magneto Impedance Effect; Research Report, vol. 35 No. 4; Dec. 2000; pp. 15-20.

Pullini, Daniele, et al.; Co/Cu Nanowire Systems for GMR Sensing Applications; Nanowires—Implementations and Applications; Jul. 2011; pp. 223-244.

Davis, Despina; Electrodeposition of Multilayered Nanostructures for Giant Magnetoresistance and Thermoelectric Applications; A Dissertation Submitted to the Graduate Faculty of the Louisiana State University Agricultural and Mechanical College in partial fulfillment of the requirements for the degree of Doctor of Philosphy in The Interdepartmental Program in Engineering Science; May 2007.

Shakya, P., et al.; Giant Magnetoresistance and Coercivity of electrodeposited multilayered FeCoNi/Cu and CrFeCoNi/Cu; Journal of Magnetism and Magnetic Materials 324 (2012); Available online Aug. 2011; pp. 453-459.

Piraux, L., et al.; Giant Magnetoresistance in Magnetic Multilayered Nanowires; Appl. Phys. Lett., vol. 65, No. 19, Nov. 7, 1994; pp. 2484-2486.

Tang, X.-T., et al.; Layer Thickness Dependence of CPP Giant Magnetoresistance in Individual CoNi/Cu Multilayer Nanowires Grown by Electrodeposition; Physical Review B 75; Apr. 3, 2007; pp. 134404-1-134404-10.

Bentley, Anne K., et al.; Template Synthesis and Magnetic Manipulation of Nickel Nanowires; Journal of Chemical Education; vol. 82 No. 5; May 2005; pp. 765-768.

Chen, Pochiang, et al.; Inkjet Printing of Single-Walled Carbon Nanotube/RuO2 Nanowire Supercapacitors on Cloth Fabrics and Flexible Substrates; Springer, Research Article, DOI 10.1007/s12274-010-0020-x; Jun. 2010.

Madaria, Anuj R.; et al.; Large scale, highly conductive and patterned transparent films of silver nanowires on arbitrary substrates and their application in touch screens; IOPscience, Nanotechnology 22 (2011) 245201; Apr. 2011.

Liu, Cai-Hong, et al.; Silver nanowire-based transparent, flexible, and conductive thin film; nanoscale Research Letters 2011, 6:75; 2011.

Madaria, Anuj R., et al.; Uniform, Highly Conductive, and Patterned Transparent Films of a Percolating Silver Nanowire Network on Rigid and Flexible Substrates Using a Dry Transfer Technique; Springer, Research Article, DOI 10.1007/s12274-010-0017-5; Jun. 2010.

Berger, Michael; The first printable magnetic sensor that relies on the giant magnetoresistance effect; Jul. 19, 2012; Nanowerk; available online at http://www.nanowerk.com/spotlight.spotid=26011.php.

Maqableh, Mazin M., et al.; CPP GMR Through Nanowires; IEE Transactions on Magnetics, vol. 48, No. 5; May 2012; pp. 1744-1750.

Rife, J.C., et al.; Design and performance of GMR sensors for the detection of magnetic microbeads in biosensors; for Sensors and Actuators A; Mar. 19, 2003; pp. 1-34.

Mao, M. et al.; GMR in DC Magnetron Sputtered Ni81Fe19/Cu Multilayers; IEEE Transactions on Magnetics, vol. 34, No. 4, Jul. 1998; pp. 915-917.

Prieto, Maria Jose Calderon; Magnetic and electric properties of systems with colossal magnetoresistance; Presented in the Department of Condensed Matter Physics of the Science Faculty of the Universidad Autonoma de Madrid; May 2001.

Reig, Candid, et al.; Magnetic Field Sensors Based on Giant Magnetoresistance (GMR) Technology: Applications in Electrical Current Sensing; Sensors 2009, 9, 7919-7942; doi: 10.3390/s91007919; Oct. 12, 2009.

Lenz, James, et al.; Magnetic Sensors and Their Applications; IEEE Sensors Journal, vol. 6, No. 3; Jun. 2006; pp. 631-649.

Prinz, Gary A.; Magnetoelectronics; Science's Compass Review; Science; vol. 282; Nov. 27, 1998; pp. 1660-1663.

Routkevitch, Dmitri A., et al.; Nonlithographic Nano-Wire Arrays: Fabrication, Physics, and Device Applications; IEEE Transactions on Electron Devices, vol. 43, No. 10., Oct. 1996; pp. 1646-1658.

Pike, G.E., et al.; Percolation and conductivity: A computer study. I*.; Physical Review B, vol. 10, No. 4; Aug. 15, 1974; pp. 1421-1434.

Nobelprize.org; Peter Grunberg—Autobiography; Nobelprize.org; Accessed via the Web on Apr. 14, 2013; pp. 1-7.

Valet, T., et al.; Theory of the Perpendicular Magnetoresistance in Magnetic Multilayers; Physical Review B, vol. 48, No. 10; Sep. 1, 1993; pp. 7099-7113.

Liu, K., et al.; Perpendicular Giant Magnetoresistance of Multilayered Co/Cu Nanowires; Phys. Rev. B 51, 7381(R)—Published Mar. 15, 1995; pp. 7381-7384.

Ohgai, Takeshi; Magnetoresistance of Nanowires Electrodeposited into Anodized Aluminum Oxide Nanochannels, ISBN 978-953-51/0898-6, 434 pages, Publisher: InTech, Chapters published Dec. 19, 2012 under CC by 3.0 license DOI: 10.5772/3367, pp. 101-125.

* cited by examiner

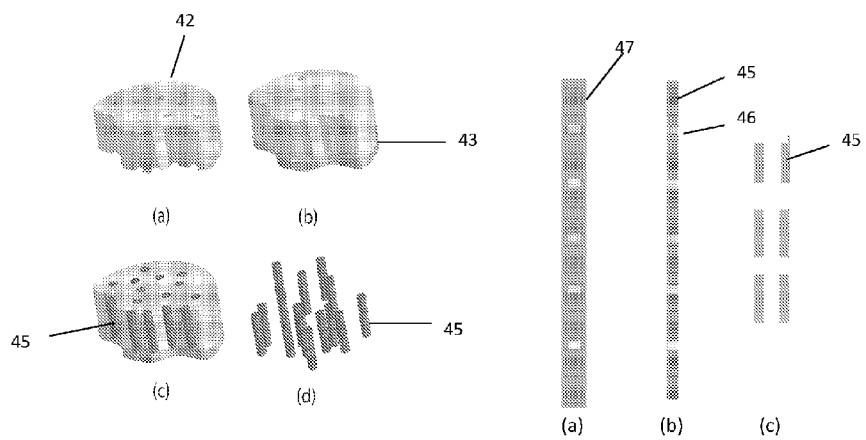
Figure 3A  Figure 3B
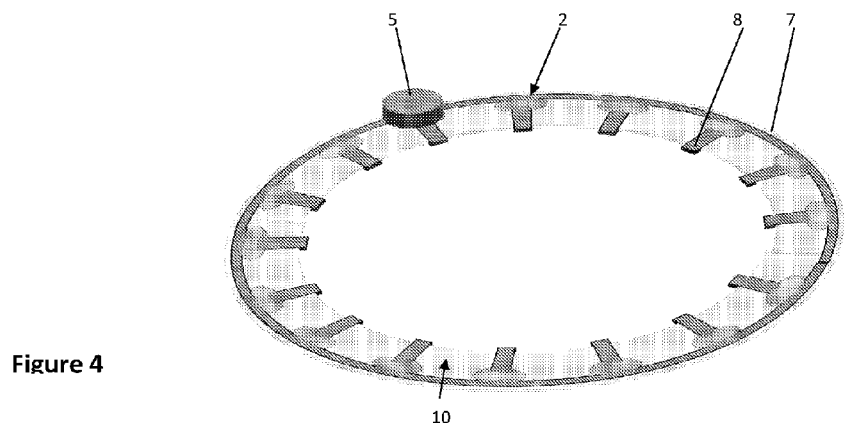
Figure 4

GMR NANOWIRE SENSORS

CROSS-REFERENCE TO RELATED APPLICATIONS

This application is a continuation-in-part of application Ser. No. 13/801,100 filed Mar. 13, 2013, which claims the benefit under 35 USC 119(e) of U.S. Provisional Application Ser. No. 61/622,605 filed Apr. 11, 2012, both of which are incorporated by reference herein in their entirety.

STATEMENT REGARDING FEDERALLY SPONSORED RESEARCH OR DEVELOPMENT

This invention was made with government support under grant number NNX10AI40H awarded by the National Aeronautics & Space Administration. The government has certain rights in the invention.

BACKGROUND OF INVENTION

Magnetoresistance (MR) is the property of a material to change its electrical resistance in the presence of a magnetic field. Magnetic sensors based on the MR effect can measure the strengths of magnetic fields or the relative direction of the fields. One of the most significant applications of MR sensors is their incorporation into read heads for magnetic recording devices. Five distinct types of MR are ordinary magnetoresistance (OMR), anisotropic magnetoresistance (AMR), giant magnetoresistance (GMR), tunneling magnetoresistance (TMR) and colossal magnetoresistance (CMR).

There are two types of GMR geometries, which are named current in plane (CIP) and current perpendicular to the plane (CPP). Each geometry has a different quantum mechanical effect that changes the probability of conduction electrons scattering throughout their layers and consequently changing the electrical resistance of the GMR material. CIP GMR describes a geometry whereby the magnetic field must be applied in the same direction as the current flow for a change in resistance to be observed in the material and the change in the mean free path of conduction electrons determines the amount of resistance change. Alternatively, CPP GMR refers to a geometry typically having multilayers in high aspect ratio configurations. With CPP GMR, a magnetic field must be applied perpendicular to the current flow for resistance changes to be observed. The magnetic field alters the magnitude of the spin-flip diffusion length of conduction electrons, influencing the resistance change of the GMR material. CPP GMR performance is partially a function of the number of alternating material layers with a higher number of layers giving higher changes in resistances in magnetic fields.

BRIEF DESCRIPTION OF DRAWINGS

FIGS. 3A and 3B further illustrate methods of forming nanowires.

FIG. 4 illustrates a second embodiment of a one dimensional position sensor.

DETAILED DESCRIPTION OF SELECTED EMBODIMENTS

Figure 1:
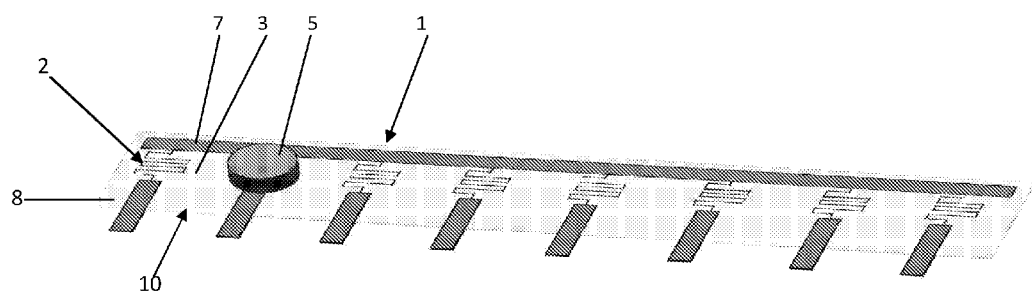
FIG. 1 illustrates one embodiment of a one dimensional position sensor.

One embodiment of the present invention is a magnetic position sensor 1 such as illustrated in FIG. 1. The position sensor 1 includes at least one, and more typically a series of, magnetic field sensors 2 formed on a substrate 10. In this embodiment, the magnetic field sensors 2 are shaped as a serpentine line 3 of GMR nanowires formed upon substrate 10. The ends of serpentine line 3 are connected to conductors 7 and 8 which ultimately will connect the magnetic field sensor 2 to a detection circuit. Although more detailed examples of detection circuits are provided below, the detection circuit will generally measure the resistance of the sensors. Two common resistance measurements include: first, by changing a resistance into a corresponding voltage for measurement purposes; and secondly, by placing the sensor in a RC circuit and measuring the charging and discharge rate of the capacitor.

In this embodiment, the serpentine lines 3 are approximately 0.5 mm to 1 mm wide, but may be narrower or wider, e.g., about 0.01 to 10 mm. The lines 3 are formed by adhering (e.g., drying or curing) a GMR nanowire carrier solution onto the substrate 10 in the pattern of the serpentine lines. The GMR nanowire carrier liquid adhered to or dried upon a substrate may be referred to as a solidified layer of GMR nanowires. As used herein, "nanowire" or "nanostructure" generally refers to small structures, at least one dimension of which (i.e., width or diameter) is less than 1000 nm, more typically, less than 500 nm or 100 nm or 50 nm. In various embodiments, the width or diameter of the nanostructures are in the range of 10 to 40 nm, 20 to 40 nm, 5 to 20 nm, 10 to 30 nm, 40 to 60 nm, or 50 to 70 nm. The length of a nanowire may vary in different embodiments from less than 1 micron to several hundred microns (e.g., 500 microns). In many embodiments, the GMR nanowires in the carrier solution may have a diameter of less than about 0.5 um and a length less than about 200 um. More preferably, the GMR nanowires will have a diameter between about 10 nm and about 200 nm and a length between about 1 um and about 100 um. Of course, other specialized embodiments may have nanowire diameters greater than 0.5 um and lengths greater than 200 um. In many embodiments, the GMR nanowires will have an aspect ratio (i.e., length over diameter) of at least two or three and more preferably at least about 10, and still more preferably at least about 50 (or at least any integer between 2 and 50). The term "nanowire" includes any elongated structure such as nanorods (solid nanostructures) and nanotubes (hollow nanostructures), whether the cross-section is generally round or some other shape.

In many embodiments, the concentration of GMR nanowires within the carrier solution may be between about 0.005 and about 10 percent by weight of the solution, or any subrange there between. In certain embodiments, the concentration of GMR nanowires within the carrier solution is between about 0.01 and about 1.5 percent. Naturally, other embodiments could be less than 0.01 or greater than 10 percent. When the dried GMR nanowire layer is formed on the substrate, the nanowires will generally be present in a quantity ranging from about 1,000 nanowires per $mm^2$ to about 50,000 nanowires per $mm^2$ or any subrange there between. As a general principle, the longer the nanowires, the fewer needed to form a connective nanowire network for magnetoresistance measurement. Again, particular embodiments could employ fewer than 100 nanowires per $mm^2$ or more than 5,000,000 $mm^2$ (or any subrange between these values).

The GMR nanowires are often suspended or dispersed in a carrier liquid to facilitate their deposition on the substrate. Typically, the GMR nanowires are at least temporarily suspended in the carrier fluid. However, the nanowires only need remain suspended long enough to be applied to the substrate material. Preferably, the carrier fluid should be homogeneous, i.e., the GMR nanowires should be suspended uniformly in the carrier solution. It is understood that, as used herein, "deposition" and "coating" are considered interchangeable. Any number of fluids may be used as the nanowire carrier fluid. For example, any non-corrosive liquid in which the GMR nanowires can form a stable dispersion may be used. Preferably, the GMR nanowires are dispersed in water, an alcohol, a ketone, ethers, hydrocarbons or an aromatic solvent (benzene, toluene, xylene, etc.). More preferably, the liquid is volatile, having a boiling point of no more than 200° C., no more than 150° C., or no more than 100° C.

In addition, the GMR nanowire carrier fluid (or "dispersion") may contain binders and other additives to control viscosity, corrosion, adhesion, and nanowire dispersion.

A binder may be any material or substance that holds or draws other materials together to form a cohesive whole. Binders may include gelling or thickening agents along with viscosity modifiers. Examples of suitable binders include, but are not limited to, carboxy methyl cellulose (CMC), 2-hydroxy ethyl cellulose (HEC), hydroxy propyl methyl cellulose (HPMC), methyl cellulose (MC), poly vinyl alcohol (PVA), tripropylene gylcol (TPG), and xanthan gum (XG).

Examples of suitable viscosity modifiers include biopolymers, such as hydroxypropyl methyl cellulose (HPMC), methyl cellulose, xanthan gum, tragacanth gum, carboxy methyl cellulose, and hydroxy ethyl cellulose; acrylic polymers, such as, sodium polyacrylate; and water-soluble synthetic polymers, such as, polyvinyl alcohol.

Surfactants are compounds that lower the surface tension of a liquid, the interfacial tension between two liquids, or that between a liquid and a solid. Surfactants may act as detergents, wetting agents, emulsifiers, foaming agents, and dispersants. Examples of surfactants may include ethoxylates, alkoxylates, ethylene oxide and propylene oxide and their copolymers, sulfonates, sulfates, disulfonate salts, sulfosuccinates, phosphate esters, and fluorosurfactants (e.g., Zonyl® by DuPont). More particular examples of suitable surfactants include Zonyl® FSN, Zonyl® FSO, Zonyl® FSH, Triton (×100, ×114, ×45), Dynol (604, 607), n-Dodecyl b-D-maltoside and Novek.

In one example, the nanowire dispersion may include, by weight, from 0.0025% to 0.1% surfactant (e.g., a preferred range is from 0.0025% to 0.05% for Zonyl® FSO-100), from 0.02% to 4% viscosity modifier (e.g., a preferred range is 0.02% to 0.5% for HPMC), from 94.5% to 99.0% solvent and from 0.01% to 1.4% GMR nanowires.

Solvents help adjust the curing rate and viscosity of the solution in its liquid state. The solvents evaporate off as the solution dries. There are two types of carrier solutions: solvent-based and water-based. Examples of suitable solvents include alcohols, ketones, ethers, hydrocarbons or aromatic solvents (benzene, toluene, xylene, etc.) as mentioned above. The ratios of components of the dispersion may be modified depending on the substrate and the method of application used. The viscosity range of the GMR nanowire carrier liquid may vary greatly depending on the method of application, For inkjet printing applications, the viscosity can range from about 1 to about 40 cP; for gravure printing about 40 to about 200 cP; and for screen printing, over 1000 cP. Thus the viscosity may generally range from about 0.3 to about 2000 cP (or any subrange in between). One preferred viscosity range for the nanowire dispersion is between about 1 and 40 cP (or any subrange there between). Certain embodiments of the carrier fluid may include flux concentrator agents such as nanoparticles from an alloy consisting of cobalt, magnetite, or iron. Additional information on carrier fluids may be found in U.S. Pat. No. 8,174,667 which is incorporated by reference herein in its entirety.

The GMR nanowires themselves are typically constructed by alternating ferromagnetic and non-magnetic conductive layers. Typically, these will be CPP GMR nanostructures In certain embodiments, the ferromagnetic conductive layers are less than 100 nm (in one example 15 nm) in thickness and non-magnetic conductive layers are less than 50 nm (in one example 5 nm) in thickness. The GMR nanowires comprise at least 2 alternating ferromagnetic and non-magnetic conductive layers, and more typically, will comprise tens, hundreds, or even thousands of alternating layers. While many embodiments of the GMR nanowires will have at least 5, 10, 25, or 50 alternating layers, certain embodiments could have fewer alternating layers. Example compounds forming the ferromagnetic layer may include Co, CoFe, CoNiFe, CoNi, CoNiFeCr, CoCr, CoNiCr, NiFe, NiCo, or NiCoCr. Example materials forming the non-magnetic conductive layer include Cu, Ag, Au or alloys of these metals. One particular example of a GMR structure is disclosed in U.S. Pat. No. 7,016,168 which is incorporated by reference herein in its entirety. In this example, the GMR structure includes a seed layer; a pinning layer formed of an antiferromagnetic material formed on the seed layer; and a synthetic antiferromagnetic pinned layer formed on the pinning layer. The pinned layer further comprises: a first ferromagnetic layer; an antiferromagnetically coupling layer formed on the first ferromagnetic layer; a second ferromagnetic layer formed on the coupling layer; and wherein the magnetizations of the first and second ferromagnetic layers are antiparallel. In this embodiment, the first ferromagnetic layer is a layer of CoFe formed to a thickness between approximately 20 and 60 angstroms; the second ferromagnetic layer is a layer of CoFe formed to a thickness between approximately 20 and 60 angstroms; and the coupling layer is a layer of Ru formed to a thickness between approximately 6 and 9 angstroms. Naturally, the above is merely one example of an acceptable GMR structure and many conventional or future developed GMR structures may be employed in the present invention. Likewise, the GMR nanowires could be formed by any number of conventional or future developed fabrication techniques. One illustrative example suggested in FIG. 3A is a method including the steps of (a) providing a substrate such as a anodized aluminum oxide (AAO) membrane 42 with nano size pores, i.e., pores less than about 0.5 um in diameter and at least 1 μm in depth; (b) making one side of the AAO membrane conductive by applying a conductive material 43, (c) forming alternating ferromagnetic and non-magnetic conductive layers within the pores; and (d) dissolving the AAO membrane in order to release the GMR nanowires 45.

This method is a template assisted nanowire fabrication technique. The template (i.e., the AAO membrane) has many nano size pores that serve as a mold for the formation of a single nanowire. AAO membranes are used as templates in many nanotechnology applications to eliminate the need for expensive lithographical techniques. The formation of the nanoporous AAO membranes is done by an electro-chemical process that changes the surface chemistry of the metal, by oxidation, resulting in an anodic oxide layer. By tightly controlling the pH of the electrolyte and voltage used during the AAO fabrication, highly ordered arrays of cylindrical shaped nanopores can be formed with well-regulated pore diameters, periodicities and density distributions.

Usually the bottom of the template is made conductive by sputtering on a metal, such as gold, in order to form a base substrate for the formation of nanowires. Although many different materials may be used for the template, e.g. polycarbonate membranes, preferred embodiments include anodized aluminum oxide membrane templates because they possessed a higher uniformity of pores at a higher density. For example, the aluminum oxide pore sizes may range from 10 nm-200 nm, with a pore density of $9 \times 10^8$ to $2 \times 10^{11}$ pores/cm$^2$, and an aluminum oxide film thickness of about 15 μm to 150 μm.

Figure 2:
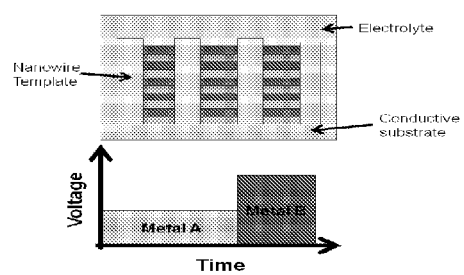
FIG. 2 illustrates one method of forming nanowires for use in the position sensors.

As referenced above, the substrate was made conductive by sputtering a gold layer and this allows the deposition of nanowires into the template through an electrodeposition or electroplating process. FIG. 2 suggests the pores of a membrane template with the conductive substrate serving as a cathode. The membrane is connected as a cathode in a standard electrochemical setup with the template, anode, cathode, and reference electrode positioned in an electrolyte solution containing ions of the metals to be deposited. When a constant DC voltage is applied in the electroplating process, metal ions from the electrolyte solution will travel inside the nanopores and bond with the substrate and as the deposition continues to take place, metal nanowires are formed inside the pores.

Formation of GMR nanowires typically requires the electroplating multilayers of two or more separate metals or alloys within the template. Deposition of multilayers from one electrolyte solution may be accomplished by choosing metals with high differences in standard electrode potentials. To overcome the problem of depositing alloys instead of pure metals in electrodeposited multilayer materials, the electrolyte solution should contain only traces of metal A ions with a high concentration of metal B ions (assuming that metal A has a higher standard electrode potential than metal B). At an adequately low polarization potential the rate of deposition of metal B is high while the rate of deposition of metal A is slow because it is controlled by diffusion. When the potential is at a considerably less negative polarization potential, only metal A is deposited. As the potential is cycled between the two potentials, multilayers of substantially pure metal A and metal B with traces of metal A are formed, as suggested in FIG. 2.

In this embodiment, a pulsing potential electrodeposition technique scheme was used to electrodeposit the multilayer GMR nanowires. In one example, in order to ensure that the layers that are deposited are flat, a copper base is formed at the bottom of the membrane by keeping the potential at −0.25 V for 2 hrs. However, in other examples, nanowires have been produced by keeping the potential at −0.25 V for a much shorter time, e.g., 15 minutes. After the Cu base is formed, the multilayers are deposited by first keeping the potential at −0.35 V until a total amount of 0.005 C of charge passed through the cathode for copper layers and then changing the potential to −2.2 V for 0.01 C of charge for the alloy (e.g., CoNiFeCu) layers. After deposition of the alloy layer, the potentiostat is transitioned into open circuit to prevent severe alloy dissolution during the copper deposition cycle that could damage the interfaces and leave the alloy layer thickness inexact. Following the open circuit interruption, the entire cycle is repeated over again starting with the copper layer. The length of the nanowires depended on the number of cycles performed during electrodeposition. On average, it took 30 s for a copper layer, less than is for an alloy layer, and 5 s for the open circuit stage for a total of 36 s for a complete cycle. Combing the 2 hrs for the copper base at the beginning of the fabrication process with the deposition of the multilayers, it took 17 hrs to form GMR nanowires having 1,500 layers.

After GMR nanowires of the selected metals are electrodeposited into the pores of the anodized aluminum oxide (AAO) membrane templates, the conductive bottom layer can be removed and the template can be dissolved with strong base freeing the nanowires. After the template is completely dissolved, the nanowires can then be rinsed and suspended in a carrier solution, such as DI water or isopropyl alcohol. When the nanowires are needed for further fabrication steps, ultrasonication may be used to better disperse the nanowires within the carrier solution.

Although electrodeposition within a template is described above, many different techniques could be used to create the nanowires. For example, chemical processes such as chemical vapor deposition (CVD) techniques. Alternatively, physical vapor deposition techniques could be employed, including evaporation (deposition) procedures such as (i) molecular beam epitaxy (MBE), (ii) electron beam epitaxy, or (iii) ion plating. Likewise, sputtering procedures could be used, such as (i) ion-beam sputtering, (ii) RF magnetron sputtering, or (iii) DC magnetron sputtering.

Using a template assisted fabrication method typically produces a single nanowire per pore of the template. The length of the formed nanowire is either the same as the thickness of the template or shorter. However, in certain embodiments, it may be disadvantageous to use long nanowires for magnetic sensors due to the method of applying the GMR nanowire carrier fluid. For instance, particle sizes over 2 μm may tend to clog an inkjet printer. If the length of the nanowires must be shorter, the density of nanowires must increase for conductivity and, the densities should increase exponentially when the length of the nanowires decreases linearly in order to achieve the same degree of connectivity of the nanowires.

As one solution to this difficulty, multiple smaller multilayer GMR nanowires may be created by stacking them inside a single pore as suggested in FIG. 3B. Stacking of the multilayer GMR nanowires can be accomplished by electrodepositing a sacrificial etch layer 46 (e.g., gold) between multilayer GMR nanowires. Once the template 47 is removed, the etch layer 46 can be dissolved away leaving the multilayer GMR nanowires 45. FIG. 3B shows (a) a pore with multiple multilayer GMR nanowires separated by the sacrificial etch layer, (b) the template dissolved, and (c) the sacrificial etch layers removed, creating a series of smaller nanowires.

In other embodiments, the multilayer GMR nanowires can be fabricated from multiple electrolyte baths, including one electrolyte for the ferromagnetic layer and a separate electrolyte bath for the nonmagnetic conductive layer. The GMR template can be transferred between baths either manually or through a robotic process. Likewise, the GMR nanowires may be produced by other techniques which do not necessarily employ a template.

As used herein, "substrate" refers to a material onto which the GMR nanowire layer is positioned or formed onto, whether directly or indirectly. The substrate can be rigid or flexible, clear or opaque. Suitable rigid substrates include, for example, silicon, glass, polycarbonates, acrylics, and the like. Suitable flexible substrates include, but are not limited to: polyesters (e.g., polyethylene terephthalate (PET), polyester naphthalate, and polycarbonate), polyolefins (e.g., linear, branched, and cyclic polyolefins), polyvinyls (e.g., polyvinyl chloride, polyvinylidene chloride, polyvinyl acetals, polystyrene, polyacrylates, and the like), cellulose ester bases (e.g., cellulose triacetate, cellulose acetate), polysulphones such as polyethersulphone, polyimides, silicones and other conventional polymeric films. Additional examples of suitable substrates can be found in U.S. Pat. No. 6,975,067 which is incorporated by reference herein.

In certain embodiments, the substrate may be functionalized to better receive GMR nanowires. Examples of functionalizing compounds may include 3-aminopropyltriethoxysilane (APTES), carboxylic acids, or self-assembled monolayers (SAMs). Example SAM materials include oleic acid, tetramethylammonium hydroxide, citric acid, soy lecithin, sodium dodecyl sulfate, perfluorodecyltrichlorosilane (FDTS), octadecyltrichlorosilane (OTS), polyethylene oxide (PEO), and Triton X-100 (TX-100), and polyvinyl alcohol (PVA). Various conventional or future developed techniques may be used to prevent or reduce corrosion of the GMR nanowires which would otherwise reduce magneto-resistance properties. For example, a "barrier layer" could be formed on the layer of GMR nanowires adhered to the substrate. "Barrier layer" refers to a layer that reduces or prevents gas or fluid permeation into the GMR nanowire layer. Barrier layers are well known in the art, including without limitation: see, e.g. U.S. Patent Application No. 2004/0253463, U.S. Pat. Nos. 5,560,998 and 4,927,689, EP Patent No. 132,565, and JP Patent No. 57,061,025. Furthermore, a protective film above the GMR nanowires may act as a barrier layer. For example, the protective film could be flexible and made of the same material as a flexible substrate on which the GMR nanowires positioned. Examples of protective films include, but are not limited to: polyester, polyethylene terephthalate (PET), polybutylene terephthalate, polymethyl methacrylate (PMMA), acrylic resin, polycarbonate (PC), polystyrene, triacetate (TAO), polyvinyl alcohol, polyvinyl chloride, polyvinylidene chloride, polyethylene, ethylene-vinyl acetate copolymers, polyvinyl butyral, metal ion-crosslinked ethylene-methacrylic acid copolymers, polyurethane, cellophane, polyolefins or the like; particularly preferable are PET, PC, PMMA, or TAO because of their high strength.

In other embodiments, GMR sensor structure may include other types of corrosion inhibitors, in addition to, or in lieu of the barrier layer as described above. Different corrosion inhibitors may provide protection to the metal nanowires based on different mechanisms. According to one mechanism, the corrosion inhibitor binds readily to the GMR nanowires, forming a protective film on a metal surface. These are also referred to as barrier-forming corrosion inhibitors. In one embodiment, the barrier-forming corrosion inhibitor includes certain nitrogen-containing and sulfur-containing organic compounds, such as aromatic triazoles, imidazoles and thiazoles. These compounds have been demonstrated to form stable complexes on a metal surface to provide a barrier between the metal and its environment. For example, benzotriazole (BTA) is a common organic corrosion inhibitor for copper or copper alloys. Alkyl substituted benzotriazoles, such as tolytriazole and butyl benzyl triazole, can also be used. (See, e.g., U.S. Pat. No. 5,270,364.) Additional suitable examples of corrosion inhibitors include, but are not limited to: 2-aminopyrimidine, 5,6-dimethylbenzimidazole, 2-amino-5-mercapto-1,3,4-thiadiazole, 2-mercaptopyrimidine, 2-mercaptobenzoxazole, 2-mercaptobenzothiazole, and 2-mercaptobenzimidazole.

Another class of barrier-forming corrosion inhibitors includes biomolecules that show a particular affinity to the metal surface. These include small biomolecules, e.g. cysteine, and synthetic peptides and protein scaffolds with fused peptide sequences with affinity for metals; see, e.g. U.S. application Ser. Nos. 10/654,623, 10/665,721, 10/965,227, 10/976,179, and 11/280,986, U.S. Provisional Application Ser. Nos. 60/680,491, 60/707,675 and 60/680,491.

Other barrier-forming corrosion inhibitors include dithiothiadiazole, alkyl dithiothiadiazoles and alkylthiols, alkyl being a saturated $C_6$-$C_{24}$ straight hydrocarbon chain. This type of corrosion inhibitor can self-assemble on a metal surface to form a monolayer, thereby protecting the metal surface from corroding.

According to another mechanism, a corrosion inhibitor binds more readily with a corrosive element (e.g., $H_2S$) than with the metal nanowires. These corrosion inhibitors are known as "scavengers" or "getters", which compete with the metal and sequester the corrosive elements. Examples of $H_2S$ scavengers include, but are not limited to: acrolein, glyoxal, triazine, and n-chlorosuccinimide. (See, e.g., Published U.S. Application No. 2006/0006120.) In certain embodiments, the corrosion inhibitor (e.g., $H_2S$ scavengers) can be dispersed in the matrix provided its presence does not adversely affect the optical or electrical properties of the GMR nanowire layer.

In other embodiments, the GMR nanowires can be pre-treated with a corrosion inhibitor before or after being deposited on the substrate. For example, the metal nanowires can be pre-coated with a barrier-forming corrosion inhibitor, e.g., BTA and dithiothiadiazole. In addition, the metal nanowires can also be treated with an anti-tarnish solution. Metal anti-tarnish treatments are known in the art. Specific treatments targeting $H_2S$ corrosion are described in, e.g., U.S. Pat. No. 4,083,945, and U.S. Published Application No. 2005/0148480.

In yet other embodiments, the metal nanowires can be alloyed or plated with another metal less susceptible to corrosive substances found in the nanowire's manufacturing or end-use environment. For example, adding chromium to the alloy layer should help prevent oxidation of nanowires. Likewise, using a copper gold alloy for the conductive layer should lessen the susceptibility to oxidation.

In still further embodiments, oxidation of the GMR nanowires introduced during fabrication may be reduced or removed once the carrier fluid is applied to and dried upon the substrate (depending on the nature of the matrix forming the GMR nanowire layer). Oxidation can be removed with most acids including, HCL, acetic acid, or nitric acid. Alternatively, oxidation may be removed by placing the nanowires in a reducing atmosphere, e.g., hydrogen or nitrogen.

In certain embodiments, it will be desirable for the GMR nanowire sensor layer to be substantially transparent. It will be understood that the transparency of the nanowire layer will be affected by, among other factors, the loading of nanowires therein. Likewise, higher aspect ratio nanowires allow for the formation of a sensor with a less dense network of nanowires leading to a lesser impact on optical properties. Example loading levels include about 0.05 µg/cm$^2$ to about 10 µg/cm$^2$, more preferably from about 0.1 µg/cm$^2$ to about 5 µg/cm$^2$ and more preferably from about 0.8 µg/cm$^2$ to about 3 µg/cm$^2$. These values depend strongly on the dimensions and spatial dispersion of the nanowires.

Typically, the optical transparence or clarity of the GMR nanowire sensor layer can be quantitatively defined by parameters including light transmission and haze. "Light transmission" refers to the percentage of an incident light transmitted through a medium. In various embodiments, the light transmission of the nanowire layer is between 50% and 98% (or any subrange there between). For a transparent sensor in which the nanowire layer is deposited or laminated on a substrate, the light transmission of the overall structure may be slightly diminished. Performance-enhancing layers, such as an adhesive layer, anti-reflective layer, anti-glare layer, may further contribute to reducing the overall light transmission of the transparent nanowire layer. In various embodiments, the light transmission of the transparent sensors can be at least 50%, at least 60%, at least 70%, or at least 80% and may be as high as at least 91% to 92%.

In certain embodiments, adhesion agents may be added to enhance the stability and/or promote the adhesion of the matrix and the GMR nanowires. For example, an adhesion promoter (e.g., silanes) that promotes the coupling between organic matter and inorganic matter can be used. Examples of the silane-type adhesion promoters include GE Silquest A174, GE Silquest A1100 and the like. Antioxidants such as Ciba Irgonox 1010ff, Ciba Irgonox 245, Irgonox 1035 can be used.

The GMR nanowire sensor layer may be formed by application of the carrier solution to the substrate by any number of convention or future developed application techniques. Printing technologies are sometimes divided between "sheet-based" and "roll-to-roll-based" approaches. Sheet-based techniques, such as inkjet and screen printing are best for low-volume, high-precision work. Gravure, offset and flexographic printing are more common for high-volume production, Thus, application techniques may include sheet coating, high throughput web coating, laminating, spray coating, ink jet printer application, ink pen application, metering rod application, micro-contact printing, vacuum filtration, roll-to-roll application, line patterning or an airbrush technique. In particular, the carrier solution may be applied by any printed electronics technique.

Printed electronics techniques are a set of printing methods used to create electrical devices on various substrates. Printing typically uses common printing equipment or other low-cost equipment suitable for defining patterns on material, such as screen printing, flexography, gravure, offset lithography and inkjet. Electrically functional electronic or optical inks are deposited on the substrate, creating active or passive devices, such as thin film transistors or resistors.

Figure 15:
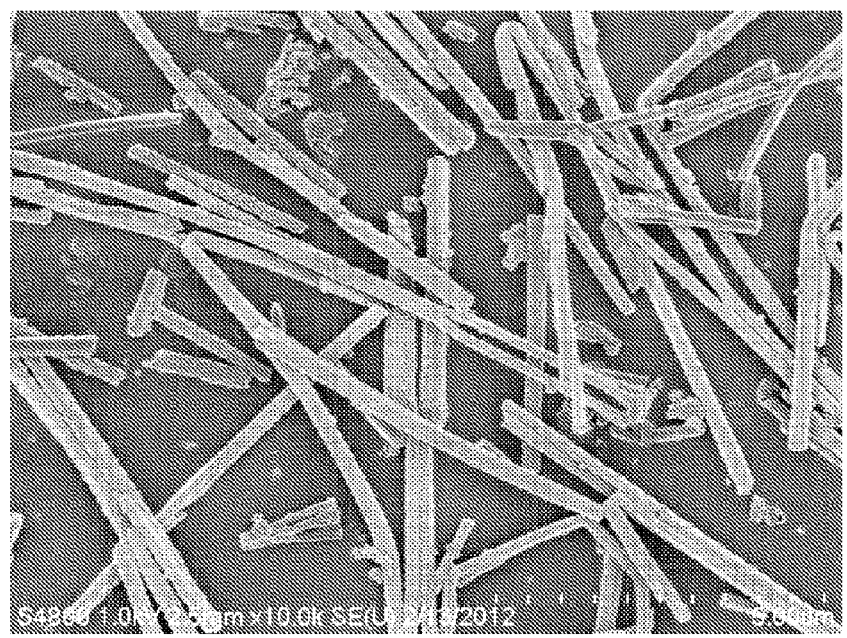
FIG. 15 is an SEM image of a solidified layer of GMR nanowires.

Typically, the fabrication processes can be carried out using conventional solution-processing equipment. Moreover, the fabrication processes are generally compatible with directly patterning the GMR nanowire layer. In the typical embodiment, the GMR nanowires being applied to a substrate in solution form results in the nanowires being positioned in a substantially random orientation when adhered to the substrate material. In other words, the nanowires will have a random orientation in the x-y plane parallel to the substrate. The SEM image of FIG. 15 showing a nanowire GMR thin film on PET substrate illustrates this random orientation. FIG. 15 also suggests how in many embodiments, the GMR nanowires will lie substantially flat on the substrate, generally parallel to the x-y plane of the substrate (e.g., oriented perpendicular to the z-axis).

As an example of sheetcoating, GMR nanowires dispersion may be initially deposited onto the substrate. A roller is rolled across a top surface of the substrate, leaving a nanowires dispersion layer on the substrate top surface. It is understood that a brush, a stamp, a spray applicator, a slot-die applicator or any other suitable applicator can be used in the place of the roller.

Web-coating has been employed in the textile and paper industries for high-speed (high-throughput) coating applications. It is compatible with the deposition (coating) processes for nanowire sensor fabrication. Advantageously, web-coating uses conventional equipment and can be fully automated, which dramatically reduces the cost of fabricating nanowire sensors. In particular, web-coating produces uniform and reproducible nanowire layers on flexible substrates. Naturally, any of the process steps described herein can be run on a fully integrated line or serially as separate operations.

Another potential process for applying the GMR nanowires is ultrasonic spray drying printing. Ultrasonic spray drying printing is the process of using an ultrasonic transducer to form aerosol particles for printing. The carrier fluid evaporates rapidly (usually before coming in contact with the substrate) leaving the dry particles from the carrier fluid to be deposited on a substrate. Carrier fluids that have low boiling points should be chosen as they evaporate more quickly. The substrate material can be heated to increase the rate of evaporation of the carrier fluid.

In certain situations, the GMR nanowires may have the tendency to aggregate together into clumps and after time sedimentation of the nanowires occurs. To overcome this problem, ultrasonication of the GMR ink (carrier fluid) may be used to help disperse the GMR nanowires and other additives more uniformly. Example ultrasonication procedures include using an ultrasonication bath or an ultrasonication probe. During the ultrasonication process, the GMR nanowires may become fragmented (break apart) or bent (curved) depending on the amount of energy and time used during the ultrasonication process.

In certain embodiments, an annealing step may be applied to GMR nanowire networks in order to promote fusion of the nanowires leading to better electrical conductivity. The nanowires may be placed in a furnace between 50° C. and 250° C. for approximately 10-180 minutes in either an air or reducing atmosphere environment. The temperature and time of the annealing process depends on the diameter, length, and chemical makeup of the nanowires. In addition, the density of nanowires in the network, additives, and substrate will affect the annealing process. Care should be taken not to "melt" the multilayers of the GMR nanowires together, which may cause a significant decrease in the magnetoresistance property. Naturally, the substrate should be of a material capable of withstanding the annealing temperatures.

Returning to FIG. 1, the position sensor 1 is formed by the magnetic field sensor 2 adhered to substrate 10 with conductors 7 and 8 ultimately connecting the magnetic field sensor 2 to a detection circuit (which is explained further below). It will be understood that as magnet 5 moves across a magnetic field sensor 2, the resistance is lowered through the GMR nanowire layer 3 and such lowered resistance may be registered with the detection circuit. Obviously, the field of sensors 2 may be arranged in any particular configuration. For example, FIG. 4 illustrates how the position sensor may have a circular configuration with conductor 7 being a formed in two semi-circular segments. The embodiment of FIG. 4 suggests how the magnetic field sensor 2 can take shapes other than serpentine lines 3. In FIG. 4, magnetic field sensor 2 is a merely a circular or elliptically shaped layer of dried GMR nanowires which is in electrical contact with the conductors 7 and 8. The used of the term "magnet" herein includes permanent magnets and/or electromagnets.

In certain embodiments, the sensor has a resistance of at least about $0.5\Omega/\square$ to $50 \text{ k}\Omega/\square$, where the "$\square$" symbol represents unit area. In other embodiments, the sensor may be characterized as having a resistance change of at least about 0.01% per mT to 5% per mT (i.e., milli-Teslas). Typically, higher sensor sensitivity is achieved using some type of flux concentrator as described in more detail below. Certain sensor embodiments may have a magnetic saturation point of around 600 mT. These sensors have a 1.6% hysteresis error for a unipolar hysteresis test and a 9.1% hysteresis error for a bipolar hysteresis test.

Figure 10:
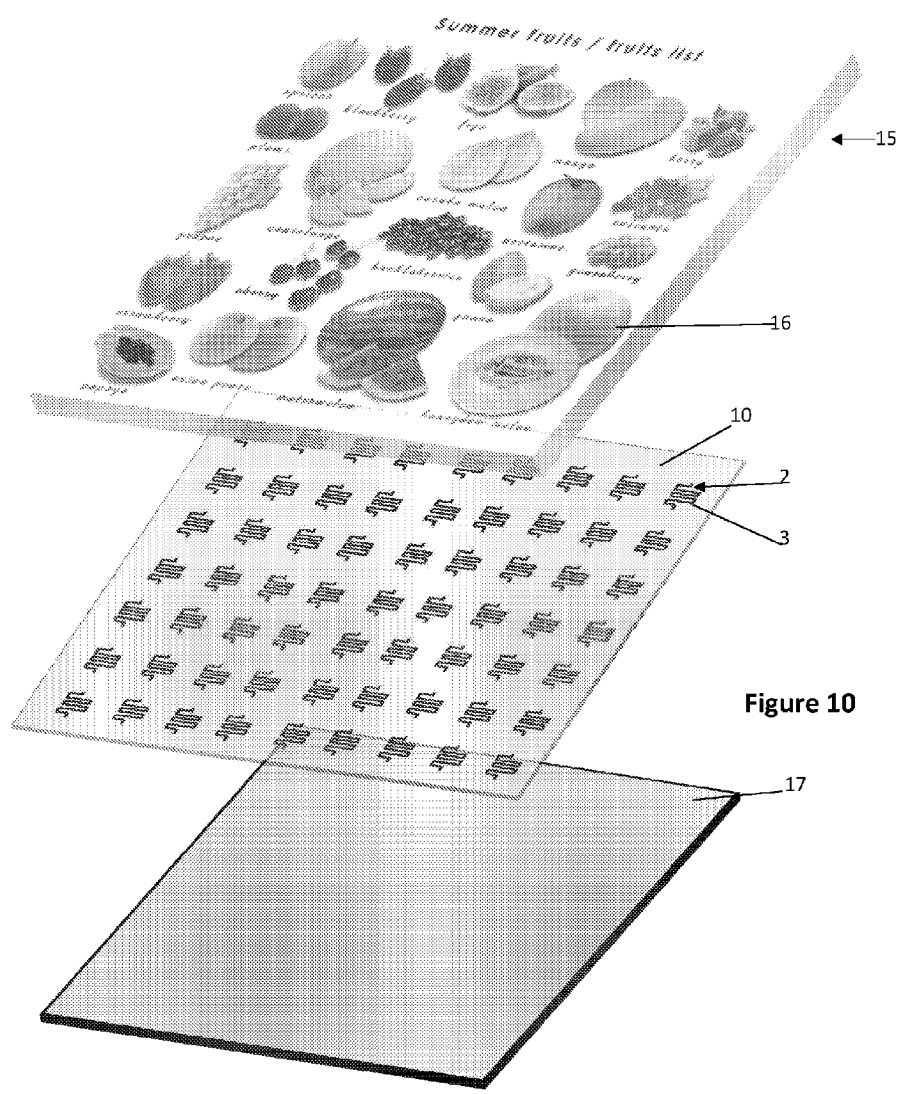
FIG. 10 illustrates a two dimensional position sensor.

A further example of a two-dimensional position sensor is seen in FIG. 10. In this embodiment, a coversheet 15 with a series of indicia (images of different fruits in this illustration) is formed of some suitable thin nonconductive, non-magnetic material. The coversheet 15 is then position on/over substrate 10 which has a series of magnetic field sensors 2 formed thereon in a two dimensional array. Although not explicitly show in FIG. 10, it will be understood that conductors will be attached to each of the sensors 2 and such conductors will be attached to a detection circuit. It can be seen how one or more of the magnetic field sensors 2 will be positioned under each indicia 16. Thus, when a magnet is placed over an indicia, at least one sensor 2 will experience a change in resistance. In the particular embodiment of FIG. 10, a ferrous material sheet 17 is positioned behind substrate 10 and will provide a means for allowing a magnet to magnetically adhere to the surface of the position sensor. It will be readily understood that a user (e.g., a shopper in a grocery store) wishing to indicate a particular fruit (e.g., at an automated price checker) will simply move a magnet over the particular fruit indicia desired. Thus, moving the magnet closer or further away from a particular sensor will result in detection by the detection circuit. "Closer or further away" includes a starting position with the magnet overlapping the sensor and then being moved to more fully cover (or uncover) the sensor. Although FIG. 10 suggests a flat two dimensional array, it may be envisioned that a flexible planar substrate could be applied to a curved surface, which should still be considered a two dimensional array for purposes of this disclosure. Nevertheless, those skilled in the art will recognize techniques for employing the concepts described herein in three dimensional configurations.

In one embodiment, the substrate material and the solidified layer of carrier fluid may be "stretchable." As used herein, a material is "stretchable" if it may elongate in at least on dimension by at least one of 5%, 10%, 15%, 20%, 30%, or 50% without the material failing or becoming unusable for its intended purpose. As one example, reversible stretchable transparent conductive electrodes may be created by spray depositing silver nanowires onto PDMS substrates with a surface treatment of Dopamine, e.g., see Akter, Tahmina, and Woo Soo Kim, "Reversibly stretchable transparent conductive coatings of spray-deposited silver nanowires." *ACS applied materials & interlaces* 4.4 (2012): 1855-1859, which is incorporated by reference herein in its entirety. Dopamine turns the normally hydrophobic PDMS surface to a hydrophilic surface. The hydrophilic PDMS surface lead to the silver nanowires adheres well to the substrate. The average nominal resistance of the silver nanowire thin film is $35\Omega/\square$. The nominal resistance remained almost unchanged up to 15% elongation at 80% transmittance. Thicker nanowire thin films lead to larger elongation of the electrode before reaching the critical point were conductivity ceases, however the transmittance is decreased.

In another example, a stretchable electrode may be created using silver nanowires by first drop casting silver nanowires onto a substrate and then pouring liquid PDMS over the nanowires, e.g., see Xu, Feng, and. Yong Zhu. "Highly conductive and stretchable silver nanowire conductors." *Advanced Materials* 24.37 (2012): 5117-5122, which is incorporated by reference herein in its entirety. The PDMS penetrates the nanowire matrix and after the PDMS cures, the silver nanowires are embedded inside the PDMS. Although the nanowire matrix is embedded it is still conductive. After stretching the electrode multiple times, the resistance tends to stabilize and the resistance remains stable up to strains of 50%.

In a third example, highly stretchable nanotube thin films are created by depositing carbon nanowires on pre-strained 3M 4905 films. This method allows for electrodes which can be strained up to %700, Hu, Liangbing, et al. "Highly stretchable, conductive, and transparent nanotube thin films." *Applied Physics Letters* 94.16 (2009): 161108, which is incorporated by reference herein in its entirety.

Figure 12:
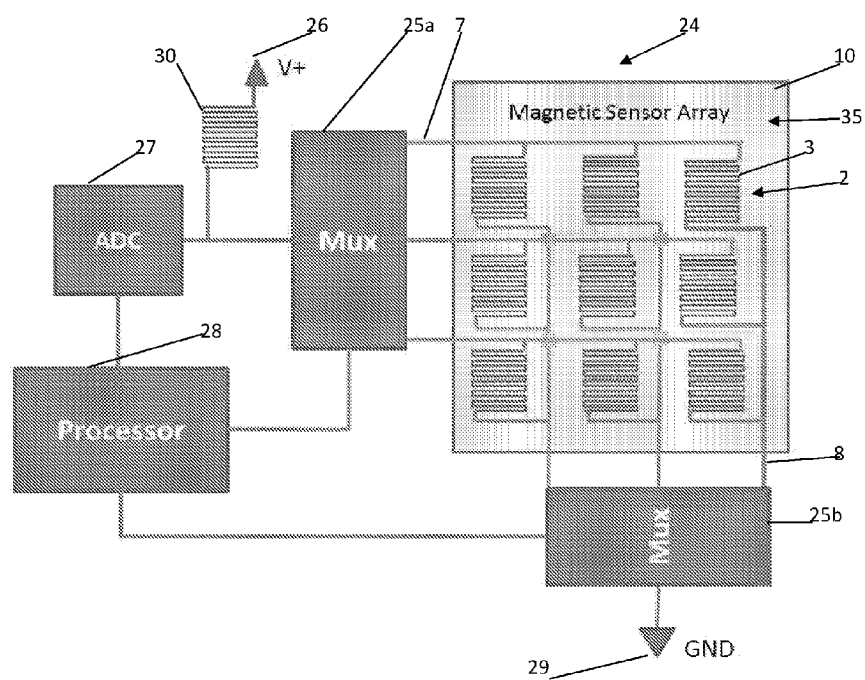
FIG. 12 illustrates one embodiment of a sensor detection circuit.

As referenced above, the illustrated position sensor embodiments will typically employ a detection circuit to identify when a magnetic field sensor 2 has encountered a change in magnetic field strength. One embodiment of such a detection circuit is seen in FIG. 12. This detection circuit 24 illustrates a substrate 10 with an array 35 of magnetic sensors 2 (in this example, serpentine line magnetic field sensors 3) positioned on the substrate 10. An output voltage is formed from a voltage divider created by a magnetic field sensor 30 and a magnetic sensor 2 located in the array 35. A resistance change from each magnetic sensor in array 35 can be identified by using this detection circuit. One of the nine sensors 2 in array 35 may be selected to form a voltage divider with sensor 30 using multiplexers 25. Multiplexer 25*a* connects the sensor rows in array 35 to analog-to-digital converter 27 and sensor 30. Sensor 30 terminates in voltage source 26. Multiplexer 25*b* connects the column of sensors in array 35 to ground 29. An output voltage is created between sensor 30 and one of the nine sensors 2 located in array 35. Conductors 7 from individual sensors 3 will terminate in a first multiplexer 25*a* while conductors 8 will terminate in a second multiplexer 25*b*. The microprocessor 28 connects the correct multiplexers channel to the multiplexers' input. An analog-to-digital converter 27 is positioned within the circuit in order to convert the voltage from the voltage divider into a digital value to be communicated to the microprocessor. Naturally those skilled in the art will recognize that circuit 24 is just one possible detection circuit and many alternative conventional and future developed detection circuits could be employed.

Figure 5:
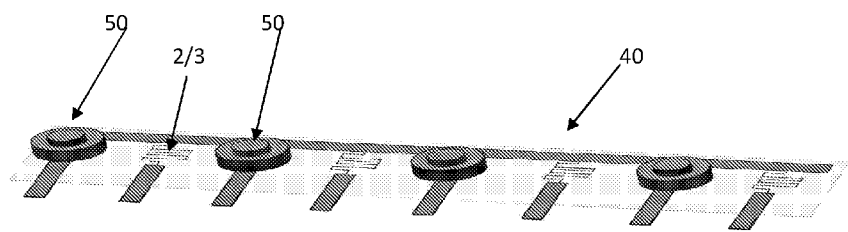
FIG. 5 illustrates a third embodiment of a one dimensional position sensor.
Figures 6A, 6B:
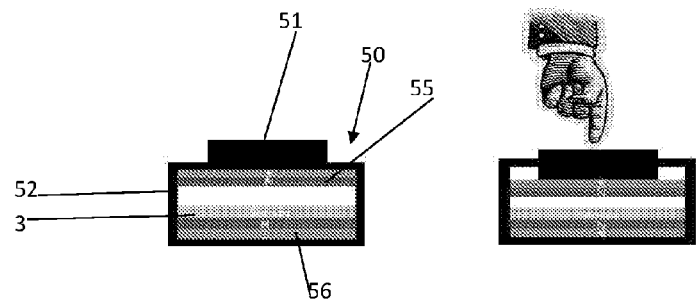
FIGS. 6A and 6B illustrate one embodiment of a push-button sensor.
Figures 7A, 7B:
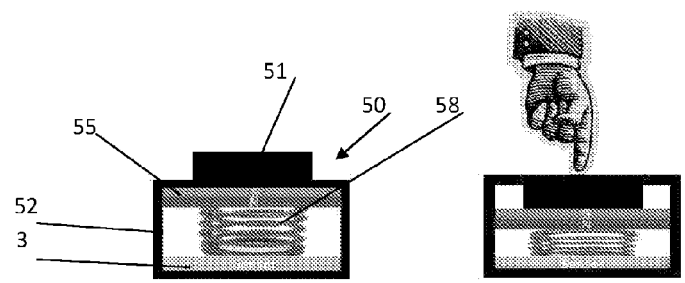
FIGS. 7A and 7B illustrate a second embodiment of a push-button sensor.

FIG. 5 illustrates an alternative position sensor arrangement. In this embodiment, "push button" magnets 50 are positioned over one or more of the magnetic field sensors 2. When the magnets are depressed, they move closer to the magnetic field sensors and reduce the resistance across the GMR nanowire serpentine line segments 3. This allows a detection circuit to distinguish which of a plurality of push button magnets 50 has been activated by a user. FIGS. 6A and 6B illustrate one example of a push button magnet structure 50. This structure generally includes the housing 52, the button 51 capable of moving upward and downward in housing 52, an upper magnet 55, a GMR nanowire sensor layer 3, and a lower magnet 56. A biasing mechanism will typically bias the magnet 55 away from GMR nanowire sensor layer 3. In FIGS. 6A and 6B, the biasing mechanism is formed by magnets 55 and 56 being positioned in opposing polar orientation, thereby having tendency to repel one another. When button 51 is depressed, magnet 55 moves closer to GMR nanowire sensor layer 3 and changes the resistance across the sensor layer 3. When the downward force on button 51 is removed, the opposing magnetic forces returns button 51 to its raised position. It will be understood that while magnet 56 affects the resistance of GMR nanowire sensor layer 3, nevertheless, the movement of magnet 55 closer to sensor layer 3 causes a further measurable change in resistance. FIGS. 7A and 7B illustrate a similar push button apparatus, but with a slightly different biasing mechanism. In this embodiment, the spring 58 is used to bias upper magnet 55 away from GMR nanowire sensor layer 3, thus eliminating the lower magnet 56 seen in FIGS. 6A and 6B.

Figure 8A:
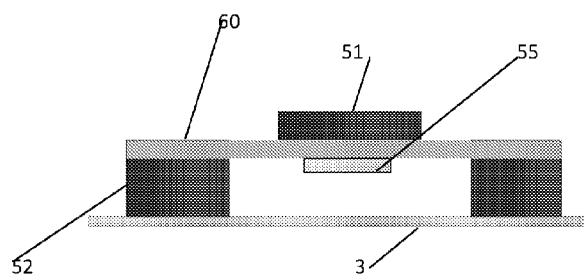
FIGS. 8A and 8B illustrate a third embodiment of a push-button sensor.
Figure 8B:
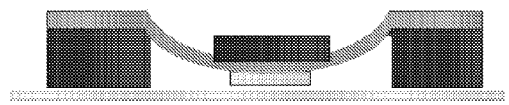

FIGS. 8A and 8B illustrate a still further embodiment of a push button assembly. In FIG. 8A, a cylindrical housing 52 has a flexible diaphragm 60 formed across its top, with the button 51 attached to diaphragm 60's top side and magnet 55 attached to its bottom side. Housing 52 is shown positioned over a GMR nanowire sensor layer 3. The diaphragm 60 may be formed of any suitable elastic material allowing depression of button 51 to move magnet 55 downward as seen in FIG. 8B and return magnet 55 to its upward position when the depressing force is removed. As described above, the pressing of button 51 is detected when the resistance across GMR nanowire sensor layer 3 is changed by the movement of magnet 55 closer to the sensor layer 3. As one example, this push button assembly could form the buttons described above in reference to FIG. 5. It will be understood that that additional layers of material could be added to many of the above embodiments. For example, a non-magnetic material layer can be between the magnets and sensors for FIGS. 1, 4, 5 in order to protect the sensors or for aesthetic purposes.

Figures 9A, 9B, 9C:
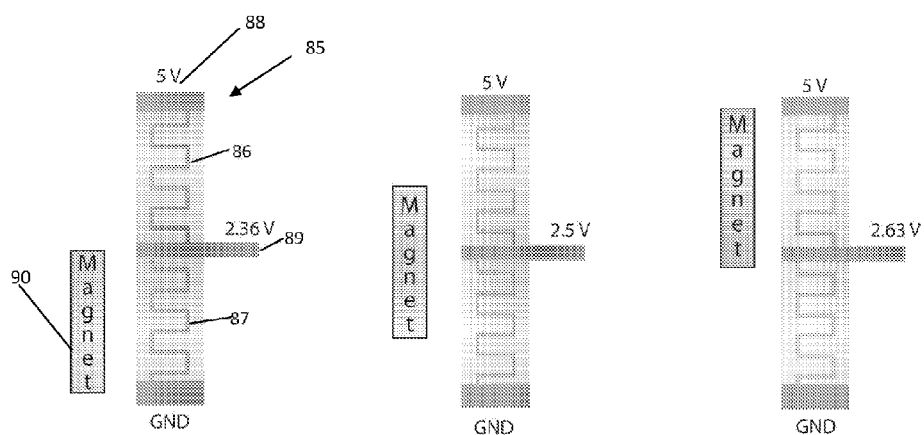
FIGS. 9A to 9C illustrate a potentiometer type device.

In another embodiment, a magnetic potentiometer could be fabricated by a three-terminal resistor structure with a sliding magnet which forms an adjustable voltage divider as in FIGS. 9A to 9C. First resister 86 and second resister 87 are created from serpentine lines of solidified GMR carrier solution. Both first resister 86 and second resister 87 are connected to output terminal 89 while first resister 86 is also connected to voltage source 88. It can be understood that as magnet 90 changes its position relative to first resister 86 and second resister 87, the respective resistance of those resisters also changes. This creates the voltage divider effect, causing the voltage at output 89 to change with respect to the position of magnet 90.

Figure 11:
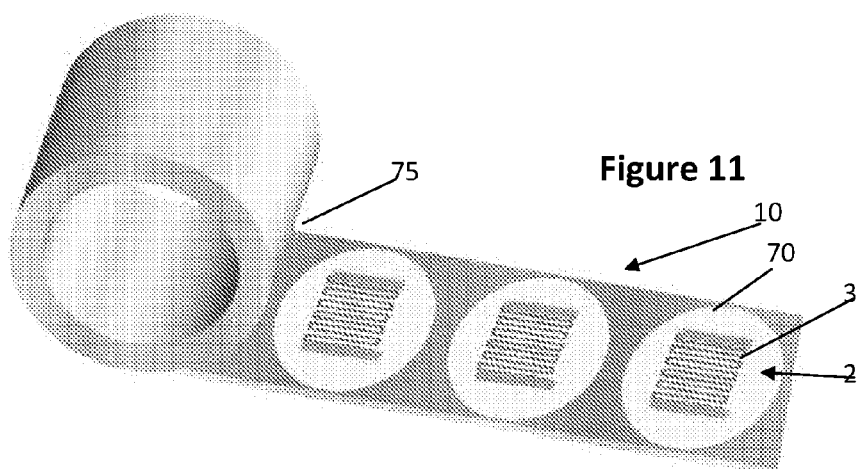
FIG. 11 illustrates sensor elements formed on a removable adhesive substrate.

FIG. 11 suggests a still further component used in different embodiments of the present invention. In FIG. 11, a carrier material 75 (e.g., a paper roll) is shown with a series of removable magnetic field sensors 2 positioned thereon. The magnetic field sensors 2 will comprise an adhesive substrate material 70 (e.g., a paper "sticker" segment with an adhesive material holding it to carrier material 75) where the GMR nanowire sensor serpentine layer 3 is formed on the adhesive substrate material. It can be visualized how these magnetic field sensors 2 may be removed from carrier material 75 and adhered to another base to form any type of sensor, including an array of sensors such shown in previous figures or otherwise. It will be understood that conductors 7 and 8 and other elements of a detection circuit seen in FIG. 12 will be connected to the array of sensors to create the desired configuration of position sensor.

One modification to the above sensors could be the use of Wheatstone bridges. GMR materials themselves are very temperature dependent; however, simple arrangements, such as Wheatstone bridge circuits, can be applied to eliminate the temperature dependence. Many commercial GMR sensors are configured in the Wheatstone bridge configuration to decrease the temperature dependence, reduce noise, and as well create a linear output for the sensor. A Wheatstone bridge configuration with two active GMR resistors and two shielded GMR resistors could be used to eliminate temperature dependence and create a linear output. The resisters in the Wheatstone bridge circuit may be formed from serpentine lines of solidified GMR carrier fluid similar to the resister structures seen in FIG. 9A. Of course, in none of the disclosed embodiments do the resisters need to be formed of serpentine lines, rather the resisters could be formed by virtually any layer (regardless of shape) of solidified GMR carrier fluid.

While the above embodiments have been described in terms of position sensors, many other types of devices could employ a similar type of GMR nanowire sensor layer. For example, magnetometers used to measure the strength or direction of a magnetic field and output a signal accordingly. A gradiometer may be used to detect magnetic field gradients found between GMR resistors in a Wheatstone bridge configuration. Unlike the magnetometer, gradiometer devices are unshielded allowing all four resistors in the Wheatstone bridge to be active. The gradiometer output can be bipolar versus unipolar and can be shaped by the use of a biasing magnet or flux guides.

The maximum current density carried by the GMR nanowire solidified layer typically depends on the loading density of the nanowires in the layer. Typically, the current through the nanowire layer will be less than 500 mA, and more preferably less than 100 mA, less than 50 mA, less than 10 mA, less than 1 mA, less than 0.5 mA, or less than 0.1 mA.

Figure 13:
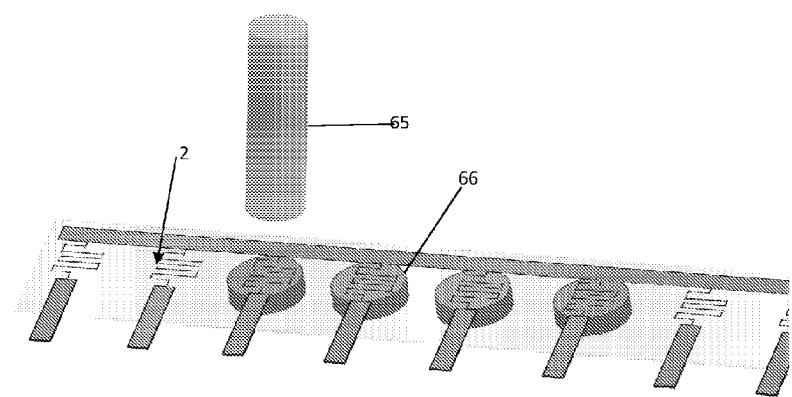
FIG. 13 illustrates one embodiment of a ferromagnetic object sensor.

FIG. 13 illustrates another embodiment where the magnetic sensors may be used for ferromagnetic (metal) object detection. Normally when no ferromagnetic object 65 is present close to the sensor 2, the magnetic field surrounding the sensor comes from a biasing magnetic field. The biasing magnetic field can come from any source 66 that produces a magnetic field, including permanent magnets, electromagnets, and the earth magnetic field. When a ferromagnetic object 65 comes into vicinity of the magnetic sensor 2, the magnetic field around the sensor is distorted and the change in the magnetic field can be detected by the sensor.

Figure 14:
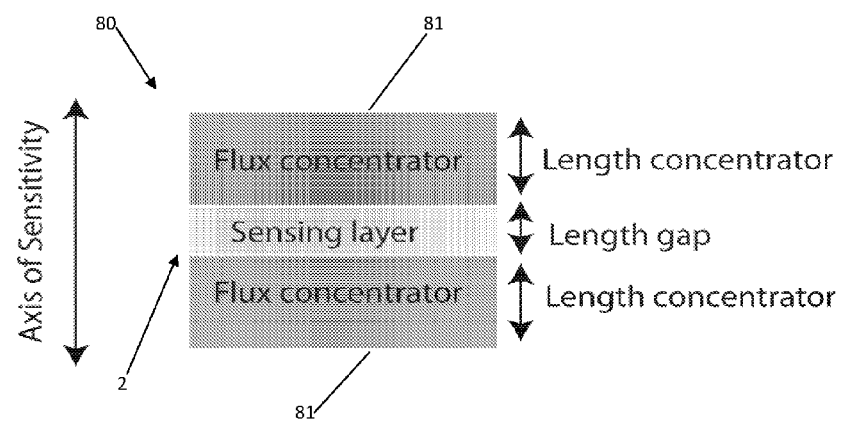
FIG. 14 illustrates one embodiment of a flux concentrator structure.

In order to enhance the sensitivity of magnetic sensors, flux concentrators, can be used to concentrate the magnetic field in the preferred direction across the magnetic sensors to achieve the desired amount of sensitivity. FIG. 14 suggests one embodiment of a flux concentrator structure 80. Elongated pieces of soft magnetic material 81 gather external magnetic flux and expose the sensor 2 to a magnetic field that is larger than the external magnetic field. Preferably, two pieces of soft magnetic material 81 of the same size are employed. The concentration factor is approximately the ratio of one flux concentrator's length to the gap between the two flux concentrators. The long dimension of the flux concentrators should butt up against the sensor structure. One example of a suitable soft magnetic material for use in the flux concentrators is a permalloy. By employing flux concentrators, the sensitivity of magnetic sensors can be increased by a factor of 2 to 100.

Although the present invention has been described in terms of specific embodiments, those skilled in the art will recognize many variations and modifications of those embodiments. For example, while most the above described embodiments deal with GMR nanowires, other nanowire types, e.g., TMR nanowires, CMR nanowires AMR nanowires, or OMR nanowires could potentially be used in alternative embodiments. All such variations and modifications are intended to come within the scope of the following claims.

The invention claimed is:

1. A magnetic position sensor comprising:
   a. at least one magnetic field sensor comprising a solidified layer of magnetoresistant nanowire carrier fluid formed on a substrate material, wherein the solidified layer of magnetoresistant nanowire carrier fluid comprises:
      i. discrete magnetoresistant nanowires each having a diameter of less than about 1 µm;
      ii. a concentration of discrete magnetoresistant nanowires in the solidified layer being at least about 0.001 percent by weight of the magnetoresistant nanowire carrier fluid; and
      iii. wherein the discrete magnetoresistant nanowires are positioned in a random orientation with respect to one another when adhered to the substrate material;
   b. a detection circuit capable of detecting a change in resistance of the magnetic field sensor; and
   c. a magnet allowing relative movement closer to or further away from the magnetic field sensor.

2. The magnetic position sensor of claim 1, wherein the discrete magnetoresistant nanowires have a length of less than about 500 µm.

3. The magnetic position sensor of claim 1, wherein the magnetic field sensor and the magnet are positioned in a housing and a biasing mechanism urges the magnet and magnetic field sensor apart, wherein the biasing mechanism is either a spring or a diaphragm of elastic or foam material.

4. The magnetic position sensor of claim 1, wherein the magnetic field sensor has a resistance of between about 0.5Ω/□ to 1 MΩ/□.

5. The magnetic position sensor of claim 4, wherein the magnetic field sensor has a resistance of between about 0.5Ω/□ to 50 k Ω/□.

6. The magnetic position sensor of claim 1, further comprising a plurality of magnetic field sensors positioned on the substrate in either a one, two, or three dimensional configuration.

7. The magnetic position sensor of claim 1, wherein the discrete magnetoresistant nanowires are either GMR nanowires, TMR nanowires, CMR, nanowires AMR nanowires, or OMR nanowires.

8. A GMR material carrying solution comprising:
   a. a carrier fluid;
   b. a concentration of discrete current perpendicular to the plane (CPP)-GMR nanowires contained in the carrier fluid, wherein:
      i. the discrete CPP-GMR nanowires each have a diameter of less than 0.5 µm;
      ii. the discrete CPP-GMR nanowires have an aspect ratio of at least three; and
      iii. the concentration of discrete CPP-GMR nanowires is at least about 0.005 percent by weight of the carrier fluid.

9. The GMR material carrying solution according to claim 8, wherein the discrete CPP-GMR nanowires have a length of less than about 250 µm.

10. The GMR material carrying solution according to claim 8, wherein the discrete CPP-GMR nanowires have an aspect ratio of at least 5.

11. The GMR material carrying solution according to claim 8, further comprising a flux concentrator agent including nanoparticles or microparticles of either cobalt, magnetite, or iron, or an alloy thereof.

12. The GMR material carrying solution according to claim 8, wherein the discrete CPP-GMR nanowires are suspended substantially uniformly throughout the carrier fluid.

13. A method of forming a magnetic field sensor comprising the step of adhering a solidified layer of GMR nanowire carrier fluid to a substrate material, wherein the GMR nanowire carrier fluid comprises:
   i. discrete GMR nanowires in the carrier fluid each having a diameter of less than about 0.5 µm; and
   ii. the discrete GMR nanowires being positioned in a random orientation when adhered to the substrate material.

14. The method of forming the magnetic field sensor according to claim 13, wherein the discrete GMR nanowires (i) have a length of less than about 250 µm, and (ii) a concentration in the carrier fluid of between about 0.001 and about 20 percent by weight of the carrier fluid.

15. The method of forming the magnetic field sensor according to claim 13, further comprising the step of applying conductive leads on the substrate material which connect to the area of the substrate material having the solidified layer of carrier fluid.

16. The method of forming the magnetic field sensor according to claim 13, wherein the carrier fluid is substantially transparent and the substrate material is substantially transparent.

17. The method of forming the magnetic field sensor according to claim 13, wherein the step of adhering the solidified layer of the GMR nanowire carrier fluid is accomplished with a spray drying process.

* * * * *